(12) United States Patent
Herrmann et al.

(10) Patent No.: US 8,556,504 B2
(45) Date of Patent: Oct. 15, 2013

(54) THERMALLY DECOUPLED MICRO-STRUCTURED REFERENCE ELEMENT FOR SENSORS

(75) Inventors: Ingo Herrmann, Friolzheim (DE); Daniel Herrmann, Tuebingen (DE); Frank Freund, Stuttgart (DE); Ando Feyh, Palo Alto, CA (US); Martin Eckardt, Stuttgart (DE)

(73) Assignee: Robert Bosch GmbH, Stuttgart, DE (US)

( * ) Notice: Subject to any disclaimer, the term of this patent is extended or adjusted under 35 U.S.C. 154(b) by 0 days.

(21) Appl. No.: 13/061,670

(22) PCT Filed: Jul. 2, 2009

(86) PCT No.: PCT/EP2009/058364
§ 371 (c)(1),
(2), (4) Date: May 23, 2011

(87) PCT Pub. No.: WO2010/025973
PCT Pub. Date: Mar. 11, 2010

(65) Prior Publication Data
US 2011/0211613 A1  Sep. 1, 2011

(30) Foreign Application Priority Data
Sep. 2, 2008  (DE) .......................... 10 2008 041 750

(51) Int. Cl.
*G01K 7/00* (2006.01)
*B32B 3/00* (2006.01)

(52) U.S. Cl.
USPC .......................................... 374/178; 425/156

(58) Field of Classification Search
USPC .......... 374/178, E07.035, 124, 129; 428/156, 428/166, 172; 257/414
See application file for complete search history.

(56) References Cited

U.S. PATENT DOCUMENTS 6,372,656 B1 * 4/2002 Laermer et al. .............. 438/719

(Continued)

FOREIGN PATENT DOCUMENTS

EP  1978339 A1 * 10/2008

(Continued)

OTHER PUBLICATIONS

Xinming, Ji., Feidie Wu, Haifen Xie, Zhou Jia, Zongming Bao, Yiping Huang, "A MEMS IR thermal source for NDIR Gas Sensors", 8th International Conference on Solid-State and Integrated Circuit Technology, 2006, pp. 620-622.*

(Continued)

*Primary Examiner* — Lisa Caputo
*Assistant Examiner* — Nasir U Ahmed
(74) *Attorney, Agent, or Firm* — Maginot, Moore & Beck, LLP

(57) ABSTRACT

A micro-structured reference element for use in a sensor having a substrate and a dielectric membrane. The reference element has an electrical property which changes its value on the basis of temperature. The reference element is arranged with respect to the substrate so that the reference element is (i) electrically insulated from the substrate, and (ii) thermally coupled to the substrate. The reference element is arranged on the underside of the dielectric membrane. The reference element and side walls of the substrate define a circumferential cavern therebetween, which is also bounded by the dielectric membrane, arranged between them. The dielectric membrane is connected to the substrate. A surface area of the reference element which is covered by the dielectric membrane is greater than or equal to 10% and less than or equal to 100% of the possible coverable surface area. A surface of the cavern which is covered by the dielectric membrane is greater than or equal to 50% and less than or equal to 100% of the possible coverable surface. An edge of the reference element which faces the dielectric membrane has greater than or equal to 50% and less than or equal to 100% of its extent contacted by the dielectric membrane. Sections of the side walls of the cavern which face the dielectric membrane have greater than or equal to 50% and less than or equal to 100% of the possible size contacted by the dielectric membrane.

20 Claims, 1 Drawing Sheet

(56) References Cited

U.S. PATENT DOCUMENTS

| | | | |
|---|---|---|---|
| 6,504,153 B1 | 1/2003 | Shigenaka et al. | |
| 6,511,915 B2 * | 1/2003 | Mlcak | 438/695 |
| 6,825,057 B1 * | 11/2004 | Heyers et al. | 438/54 |
| 7,131,766 B2 * | 11/2006 | Sultan et al. | 374/29 |
| 7,276,277 B2 * | 10/2007 | Artmann et al. | 428/156 |
| 2001/0035559 A1 | 11/2001 | Ando et al. | |
| 2003/0118076 A1 * | 6/2003 | Schieferdecker et al. | 374/121 |
| 2006/0208326 A1 * | 9/2006 | Nasiri et al. | 257/414 |

FOREIGN PATENT DOCUMENTS

| | | |
|---|---|---|
| WO | 2007086424 | 8/2007 |
| WO | 2007/147663 A1 | 12/2007 |
| WO | WO 2007147663 A1 * | 12/2007 |

OTHER PUBLICATIONS

International Search Report corresponding to PCT Application No. PCT/EP2009/058364, mailed Oct. 9, 2009 (German and English language document) (7 pages).

Xinming, Ji., Feidie Wu, Jianye Wang, Zhou Jia, Zongming Bao, Yiping Huang, "A MEMS IR thermal source for NDIR Gas Sensors", 8th International Conference on Solid-State and Integrated Circuit Technology, 2006, pp. 620-622.

* cited by examiner

THERMALLY DECOUPLED MICRO-STRUCTURED REFERENCE ELEMENT FOR SENSORS

This application is a 35 U.S.C. §371 National Stage Application of PCT/EP2009/058364, filed Jul. 2, 2009, which claims the benefit of priority to Ser. No. 10 2008 041 750.5, filed Sep. 2, 2008 in Germany, the disclosures of which are incorporated herein by reference in their entirety.

BACKGROUND

The present disclosure relates to a micro-structured reference element which changes the value of an electrical property on the basis of temperature for sensors which is thermally coupled to a substrate but which is electrically insulated from said substrate. The disclosure also relates to a sensor arrangement, comprising a reference element according to the disclosure and also a micro-structured sensor element having an electrical property which changes its value on the basis of temperature. In addition, the disclosure relates to a method for operating a temperature sensor.

Semiconductor sensors can detect temperature changes, for example as a result of infrared radiation, using the electrical properties of semiconductor components such as diodes. To this end, they usually use reference elements which are kept to the temperature of the sensor substrate by design measures. Difference formation for the sensor signals and the reference signals allows even small changes in the temperature or in the infrared radiation to be sensed with a comparatively large offset signal. It is also possible to eliminate spurious signals caused by the electronics themselves. Such spurious signals may be a drift as a result of a measurement electronics temperature which has changed during operation.

On the basis of the design principle, the sensor elements should be electrically insulated and thermally decoupled from the other elements which are on the sensor substrate and from the substrate itself. By contrast, the reference elements should be electrically insulated, but thermally coupled to the substrate.

The sensor elements can be thermally decoupled by cavities, that is to say hollow spaces beneath the sensor elements. Thus, DE 10 2006 028 435 A1 discloses a sensor, particularly for spatially resolved detection, which has: a substrate, at least one micro-structured sensor element with an electrical property which changes its value on the basis of temperature, and at least one membrane above a cavern, wherein the sensor element is arranged on the underside of the at least one membrane and wherein the sensor element is arranged on the underside of the at least one membrane and wherein the sensor element is contacted by means of supply lines which run in, on or under the membrane. In particular, there may be a plurality of sensor elements in the form of diode pixels in a monocrystalline, epitaxially produced layer. The membrane may have suspension springs produced in it which hold the individual sensor elements elastically and so as to provide insulation.

The electrical insulation but thermal coupling of reference elements in the sensors described at the outset is usually achieved by virtue of the cavity beneath the reference element being omitted. As a result, the element is thus directly linked to the substrate. The electrically conductive connection between the substrate and the reference element is achieved by additional dopings, for example by a p-doped layer between two n-doped layers. A drawback of this, however, is the changed electrical properties of the reference element, since the additional doping means that said reference element is no longer equivalent to the sensor elements.

SUMMARY

The disclosure therefore proposes a micro-structured reference element for sensors, wherein the reference element has an electrical property which changes its value on the basis of temperature, the reference element is present with electrical insulation and thermal coupling in respect of a substrate, the reference element is arranged on the underside of a dielectric membrane, the reference element and the substrate have a circumferential cavern with side walls, which is also bounded by the membrane, arranged between them, and the membrane is connected to the substrate.

The reference element is characterized in that the surface area of the reference element which is covered by the membrane is >10% to <100% of the possible coverable surface area, the surface of the cavern which is covered by the membrane is ≥50% to ≤100% of the possible coverable surface, the edge of the reference element which faces the membrane has ≥50% to ≤100% of its extent contacted by the membrane, and the sections of the side walls of the cavern which face the membrane have ≥50% to ≤100% of the possible size contacted by the membrane.

On the basis of the usual definition, micro-structured elements within the context of the present disclosure have dimensions in the micron range. By way of example, the reference elements according to the disclosure may thus have a length, height and/or width of ≥1 μm to ≤1000 μm.

By way of example, a suitable substrate for the reference elements is a p-semiconductor substrate such as p-doped (100) silicon.

An electrical property which changes on the basis of temperature may be, inter alia, the electrical resistance, the current level of the current flowing through the reference element or the voltage drop across the reference element. Advantageously, the reference element is a semiconductor diode.

Electrical insulation should be understood on the basis of the usual definition and is present, by way of example, when there is a specific electrical resistance of at least $10^{10}$ Ωm.

The thermal coupling between the reference element and the substrate exists particularly when the average temperature $T_R$ of the reference element during operation is in a range from ≥90% to ≤110% of the average temperature $T_S$ of the substrate and when, during a temperature change in the substrate, the temperature of the reference element, seen in absolute values, differs from the temperature of the substrate by ≥0% to ≤10%. The thermal coupling thus relates both to the static and to the dynamic coupling of the reference element and the substrate.

The individual reference elements may each independently be provided in a cavern, or a plurality of or all the reference elements may be arranged in a common cavern.

A reference element according to the disclosure is therefore electrically equivalent to sensor elements situated on the substrate, but is thermally linked to the substrate by means of the membrane. The electrical equivalence results in a higher level of accuracy in the difference process during the measurement. In addition, only mask layouts which have changed partially in comparison with the sensor elements are required in the manufacture. This reduces the costs of manufacturing the sensor. Finally, the sensor element and the reference element undergo to some extent the same method steps during manufacture. This results in smaller differences between the sensor element and the reference element. This increases the accuracy of the sensor.

The electrical contact for the reference element can be made by means of supply lines which run in, on or under the membrane.

The reference element according to the disclosure can be manufactured by means of micro mechanical surface processes, so that only one surface needs to be machined. In this case, it is possible to work at wafer level and subsequently singularize the elements. By way of example, a first region of a doped substrate or of a doped layer produced on the substrate can be porosified, with first of all a lattice-like structure and a second region, surrounding the first region, being protected against a subsequent etching process by means of suitable doping. The first region beneath the lattice-like structure can therefore subsequently be selectively electrolytically porosified, and it may also be possible, if necessary, to achieve complete removal, in fact, of the material in this region. Subsequently, an epitaxial layer can be grown on the lattice-like structure and the surrounding substrate, with tempering of the porous region to produce a cavern being achieved during the growth or afterwards. For further details, see DE 10 2006 028 435, which was filed on Jun. 21, 2006 in Germany, the disclosure of which is incorporated herein by reference in its entirety.

The subject matter of the disclosure is also a sensor arrangement, comprising a reference element according to one the present disclosure and also a micro-structured sensor element having an electrical property which changes its value on the basis of temperature. By way of example, such a sensor arrangement may be implemented in a diode array for spatially resolved temperature measurement. Other possible fields of application are the spatially resolved spectroscopic measurement of a gas concentration or use in fingerprint sensors. The electrical supply lines to the reference elements can be connected to common supply lines, so that the individual components can be read by means of successive addressing. The large scale integration means that now only a low power consumption is necessary.

A further subject of the disclosure is a method for operating a temperature sensor, wherein a micro-structured sensor element having an electrical property which changes its value on the basis of temperature determines the temperature to be measured and wherein a reference element according to the present disclosure is used for referencing. This results in smaller differences between the sensor element and the reference element. This increases the accuracy of the sensor.

A further subject of the invention is a method for operating a temperature sensor, wherein a micro-structured sensor element having an electrical property which changes its value on the basis of temperature determines the temperature to be measured and wherein a reference element according to the present invention is used for referencing. This results in smaller differences between the sensor element and the reference element. This increases the accuracy of the sensor.

BRIEF DESCRIPTION OF THE DRAWINGS

The disclosure is explained in more detail with reference to the drawings, in which.

DETAILED DESCRIPTION

Figure 1:
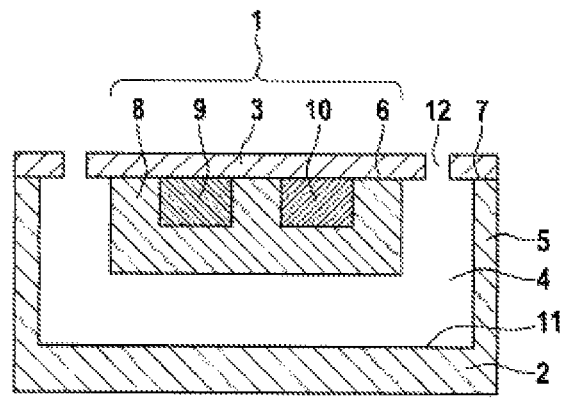
FIG. 1 shows a cross-sectional view of a reference element according to the disclosure.

FIG. 1 shows a cross-sectional view of a reference element according to the disclosure. The reference element 1 is located on a substrate 2 and herein on the underside of a dielectric membrane 3. In addition, the reference element 1 and the substrate 2 have a circumferential cavern 4 arranged between them. This means that there is no direct contact between the reference element 1 and the substrate 2 at least around the lateral edge of the reference element. This achieves electrical insulation. The outer edge of the cavern 4 is bounded by the side walls 5. The membrane 3 makes contact both with the side walls 5 of the cavern 4 and hence with the substrate 2 and with the reference element. The cavern 4 is thus also bounded at the top by the membrane 3.

The disclosure provides for the surface area of the reference element 1 which is covered by the membrane 3 to be ≥10% to ≤100% of the possible coverable surface area. The coverage may also be in a range from ≥60% to ≤95% or from ≥70% to ≤90%. It is possible for contact points for parts of the reference elements to run beneath the membrane 3. By way of example, it is thus possible to implement a degree of coverage of 100%. The possible coverable line 33 surface area of the reference element 1 is that portion of the surface of the reference element 1 which faces the membrane 3 and which, on account of the geometrical circumstances, such as coplanarity, can also be contacted by the membrane 3. Overall, attempts are thus made to use the specified coverages to make the thermal coupling between the reference element 1 and the membrane 3 and hence the substrate 2 as large as possible taking account of any other design restrictions.

The disclosure also provides for the surface of the cavern 4 which is covered by the membrane 3 to be ≥50% to ≤100% of the possible coverable surface. The coverage may also be in a range from ≥60% to ≤95% or from ≥70% to ≤90%. The coverable surface of the cavern 4 is the notional surface of the cavern 4, which is situated between the side walls 5 and the reference element 1 and can therefore also be covered by the membrane 3. Overall, attempts are thus made to use the specified coverages to make the thermal coupling path between the reference element 1 and the membrane 3 and hence the substrate 2 as large as possible taking account of any other design restrictions.

In addition, the disclosure provides for the edge 6 of the reference element 1 which faces the membrane 3 to have ≥50% to ≤100% of its extent contacted by the membrane 3. The contact may also be in a range from ≥60% to ≤95% or from ≥70% to ≤90%. The aim of this is for the junction between the section membrane 3 above the cavern 4 and the section of the membrane 3 above the reference element 1 not just to be punctiform, which would result in poor thermal coupling. On the contrary, the aim is to use the specified contact values to make the thermal coupling path between the reference element 1 and the membrane 3 and hence the substrate 2 as large as possible taking account of any other design restrictions.

Finally, the disclosure provides for the sections 7 of the side walls 5 of the cavern which face the membrane 3 to have ≥50% to ≤100% of the possible size contacted by the membrane 3. The contact may also be in a range from ≥60% to ≤95% or from ≥70% to ≤90%. The aim of this is for the junction between the section membrane 3 above the cavern 4 and the section of the membrane 3 above the substrate 2 not just to be punctiform, which would result in poor thermal coupling. On the contrary, the aim is to use the specified contact values to make the thermal coupling path between the reference element 1 and the membrane 3 and hence the substrate 2 as large as possible taking account of any other design restrictions.

In one embodiment of the reference element, said reference element comprises a monocrystalline layer 8, produced on the underside of the membrane 3, with at least one pn junction between a positively doped region 9 and a negatively doped region 10. In this case, it is preferred for the monocrystalline layer 8 to comprise epitaxially grown n-doped silicon and for the pn junction to be formed by p$^+$-doped and n$^+$-doped silicon. By producing the reference elements in an epitaxial and therefore monocrystalline layer, it is possible to keep the signal noise very low. This is advantageous particularly when producing diodes or transistors.

In a further embodiment of the reference element, the membrane is in the form of a subregion of one or more dielectric layers. By way of example, another portion of the layer composite may be a material for absorbing IR radiation.

In a further embodiment of the reference element, the bottom 11 of the cavern 4 is formed within the substrate 2. In other words, the cavern is bounded at the bottom by the substrate. This variant is also shown in FIG. 1.

In a further embodiment of the reference element, the cavern 4 is formed through the substrate 2. This variant is not shown in FIG. 1. In this case, the cavern 4 is at least to some extent a continuous cavern, that is to say open at the bottom.

In a further embodiment of the reference element, the membrane 3 has continuous openings 12 to the cavern 4. Through these openings or etching accesses, an etchant can act on substrate material beneath the membrane 3, which forms the cavern.

In a further embodiment of the reference element, the material of the membrane 3 comprises silica. It is thus possible for the membrane to be constructed using established processes in semiconductor and microsystem engineering, for example using oxidation based on the LOCOS method.

Figure 2:
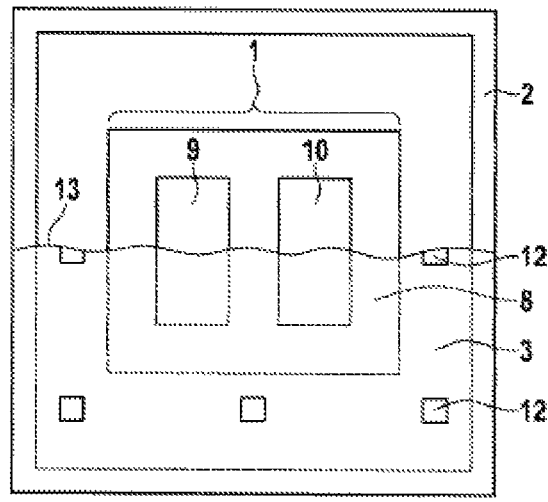
FIG. 2 shows a plan view of a reference element according to the disclosure.

FIG. 2 shows a plan view of a reference element according to the disclosure. The arrangement is borne by the substrate 2. Large portions of the substrate 2 are covered by the membrane 3. Running through the membrane 3 are openings or etching accesses 12 to different points on the membrane 3. Portions of assemblies in a reference element 1 which are located beneath the membrane are shown in dashes. A portion of the membrane 3 has been removed along the line 13 in order to clarify the drawing. The thus exposed portions of assemblies in the reference element 1 are shown by solid lines. It can thus be seen that beneath the membrane 3 is the monocrystalline layer 8 with the positively doped region 9 and the negatively doped region 10 embedded therein.

The invention claimed is:

1. A micro-structured reference element for use in a sensor having a substrate and a dielectric membrane, wherein:
   the reference element has an electrical property which changes its value on the basis of temperature,
   the reference element is arranged with respect to the substrate so that the reference element is (i) electrically insulated from the substrate, and (ii) thermally coupled to the substrate,
   the reference element is arranged on the underside of the dielectric membrane,
   the reference element and side walls of the substrate define a circumferential cavern therebetween, which is also bounded by the dielectric membrane, arranged between them,
   the dielectric membrane is connected to the substrate,
   a surface area of the reference element which is covered by the dielectric membrane is greater than or equal to 10% and less than or equal to 100% of the possible coverable surface area,
   a surface of the cavern which is covered by the dielectric membrane is greater than or equal to 50% and less than or equal to 100% of the possible coverable surface,
   an edge of the reference element which faces the dielectric membrane has greater than or equal to 50% and less than or equal to 100% of its extent contacted by the dielectric membrane, and
   sections of the side walls of the cavern which face the dielectric membrane have greater than or equal to 50% and less than or equal to 100% of the possible size contacted by the dielectric membrane.

2. The micro-structured reference element as claimed in claim 1, wherein the dielectric membrane is in the form of a subregion of one or more dielectric layers.

3. The micro-structured reference element as claimed in claim 1, comprising:
   a monocrystalline layer which is produced on the underside of the dielectric membrane; and
   at least one pn junction between a positively doped region and a negatively doped region.

4. The micro-structured reference element as claimed in claim 3, wherein the monocrystalline layer comprises epitaxially grown n-doped silicon and the pn junction is formed by p$^+$-doped and n$^+$-doped silicon.

5. The micro-structured reference element as claimed in claim 1, wherein a bottom of the cavern is formed within the substrate.

6. The micro-structured reference element as claimed in claim 1, wherein the cavern is formed through the substrate.

7. The micro-structured reference element as claimed in claim 1, wherein the dielectric membrane has continuous openings to the cavern.

8. The micro-structured reference element as claimed in claim 1, wherein a material of the dielectric membrane is silica.

9. A sensor arrangement, comprising a reference element and also a micro-structured sensor element having an electrical property which changes its value on the basis of temperature,
   wherein the reference element has an electrical property which changes its value on the basis of temperature,
   wherein the reference element is arranged with respect to a substrate so that the reference element is (i) electrically insulated from the substrate, and (ii) thermally coupled to the substrate,
   wherein the reference element is arranged on the underside of a dielectric membrane,
   wherein the reference element and side walls of the substrate define a circumferential cavern therebetween, which is also bounded by the dielectric membrane, arranged between them,
   wherein the dielectric membrane is connected to the substrate,
   wherein a surface area of the reference element which is covered by the dielectric membrane is greater than or equal to 10% and less than or equal to 100% of the possible coverable surface area,
   wherein a surface of the cavern which is covered by the dielectric membrane is greater than or equal to 50% and less than or equal to 100% of the possible coverable surface,
   wherein an edge of the reference element which faces the dielectric membrane has greater than or equal to 50% and less than or equal to 100% of its extent contacted by the dielectric membrane, and
   wherein sections of the side walls of the cavern which face the dielectric membrane have greater than or equal to 50% and less than or equal to 100% of the possible size contacted by the dielectric membrane.

10. A method for operating a temperature sensor, wherein a micro-structured sensor element having an electrical property which changes its value on the basis of temperature determines the temperature to be measured and wherein a reference element is used for referencing,
- wherein the reference element has an electrical property which changes its value on the basis of temperature,
- wherein the reference element is arranged with respect to a substrate so that the reference element is (i) electrically insulated from the substrate, and (ii) thermally coupled to the substrate,
- wherein the reference element is arranged on the underside of a dielectric membrane,
- wherein the reference element and side walls of the substrate define a circumferential cavern therebetween, which is also bounded by the dielectric membrane, arranged between them,
- wherein the dielectric membrane is connected to the substrate,
- wherein a surface area of the reference element which is covered by the dielectric membrane is greater than or equal to 10% and less than or equal to 100% of the possible coverable surface area,
- wherein a surface of the cavern which is covered by the dielectric membrane is greater than or equal to 50% and less than or equal to 100% of the possible coverable surface,
- wherein an edge of the reference element which faces the dielectric membrane has greater than or equal to 50% and less than or equal to 100% of its extent contacted by the dielectric membrane, and
- wherein sections of the side walls of the cavern which face the dielectric membrane have greater than or equal to 50% and less than or equal to 100% of the possible size contacted by the dielectric membrane.

11. A micro-structured reference element for use in a sensor having a substrate and a dielectric membrane, wherein:
- the reference element has an electrical property which changes its value on the basis of temperature,
- the reference element is arranged with respect to the substrate so that the reference element is (i) electrically insulated from the substrate, and (ii) thermally coupled to the substrate,
- the reference element is supported on the underside of the dielectric membrane,
- the reference element and side walls of the substrate define a circumferential cavern therebetween, the cavern bounded by the dielectric membrane arranged between the reference element and the side walls around the circumference of the cavern,
- the dielectric membrane is in contact with the substrate,
- a surface area of the reference element which is covered by the dielectric membrane is greater than or equal to 10% and less than or equal to 100% of the possible coverable surface area,
- a surface of the cavern which is covered by the dielectric membrane is greater than or equal to 50% and less than or equal to 100% of the possible coverable surface,
- an edge of the reference element which faces the dielectric membrane has greater than or equal to 50% and less than or equal to 100% of its extent contacted by the dielectric membrane, and
- sections of the side walls of the cavern which face the dielectric membrane have greater than or equal to 50% and less than or equal to 100% of the possible size contacted by the dielectric membrane.

12. The micro-structured reference element as claimed in claim 11, wherein the dielectric membrane is in the form of a subregion of one or more dielectric layers.

13. The micro-structured reference element as claimed in claim 11, comprising:
- a monocrystalline layer which is produced on the underside of the dielectric membrane; and
- at least one pn junction between a positively doped region and a negatively doped region.

14. The micro-structured reference element as claimed in claim 13, wherein the monocrystalline layer comprises epitaxially grown n-doped silicon and the pn junction is formed by $p^+$-doped and $n^+$-doped silicon.

15. The micro-structured reference element as claimed in claim 11, wherein a bottom of the cavern is formed within the substrate.

16. The micro-structured reference element as claimed in claim 11, wherein the cavern is formed through the substrate.

17. The micro-structured reference element as claimed in claim 11, wherein the dielectric membrane has continuous openings to the cavern.

18. The micro-structured reference element as claimed in claim 11, wherein a material of the dielectric membrane is silica.

19. A sensor arrangement, comprising a reference element and also a micro-structured sensor element having an electrical property which changes its value on the basis of temperature,
- wherein the reference element has an electrical property which changes its value on the basis of temperature,
- wherein the reference element is arranged with respect to a substrate so that the reference element is (i) electrically insulated from the substrate, and (ii) thermally coupled to the substrate,
- the reference element is supported on the underside of the dielectric membrane,
- the reference element and side walls of the substrate define a circumferential cavern therebetween, the cavern bounded by the dielectric membrane arranged between the reference element and the side walls around the circumference of the cavern,
- the dielectric membrane is in contact with the substrate,
- wherein a surface area of the reference element which is covered by the dielectric membrane is greater than or equal to 10% and less than or equal to 100% of the possible coverable surface area,
- wherein a surface of the cavern which is covered by the dielectric membrane is greater than or equal to 50% and less than or equal to 100% of the possible coverable surface,
- wherein an edge of the reference element which faces the dielectric membrane has greater than or equal to 50% and less than or equal to 100% of its extent contacted by the dielectric membrane, and
- wherein sections of the side walls of the cavern which face the dielectric membrane have greater than or equal to 50% and less than or equal to 100% of the possible size contacted by the dielectric membrane.

20. A method for operating a temperature sensor, wherein a micro-structured sensor element having an electrical property which changes its value on the basis of temperature determines the temperature to be measured and wherein a reference element is used for referencing,
- wherein the reference element has an electrical property which changes its value on the basis of temperature,
- wherein the reference element is arranged with respect to a substrate so that the reference element is (i) electrically insulated from the substrate, and (ii) thermally coupled to the substrate, the reference element is supported on the underside of the dielectric membrane, the reference element and side walls of the substrate define a circumferential cavern therebetween, the cavern bounded by the dielectric membrane arranged between the reference element and the side walls around the circumference of the cavern, the dielectric membrane is in contact with the substrate, wherein a surface area of the reference element which is covered by the dielectric membrane is greater than or equal to 10% and less than or equal to 100% of the possible coverable surface area, wherein a surface of the cavern which is covered by the dielectric membrane is greater than or equal to 50% and less than or equal to 100% of the possible coverable surface, wherein an edge of the reference element which faces the dielectric membrane has greater than or equal to 50% and less than or equal to 100% of its extent contacted by the dielectric membrane, and wherein sections of the side walls of the cavern which face the dielectric membrane have greater than or equal to 50% and less than or equal to 100% of the possible size contacted by the dielectric membrane.

* * * * *

UNITED STATES PATENT AND TRADEMARK OFFICE
CERTIFICATE OF CORRECTION

PATENT NO. : 8,556,504 B2  
APPLICATION NO. : 13/061670  
DATED : October 15, 2013  
INVENTOR(S) : Herrmann et al.

Page 1 of 1

It is certified that error appears in the above-identified patent and that said Letters Patent is hereby corrected as shown below:

On the title page, item (56), the list of References Cited should additionally include the following references:

| | | | |
|---|---|---|---|
| --DE | 198,43,984 | 3/2000 | Robert Bosch GmbH |
| DE | 10,2006,028,435 | 12/2007 | Robert Bosch GmbH |
| EP | 0,869,341 | 10/1998 | NEC CORPORATION |
| EP | 1,296,122 | 3/2003 | PerkinElmer Optoelectronics GmbH |
| EP | 1,978,339 | 10/2008 | Hamamatsu Photonics K. K.-- |

Signed and Sealed this  
Ninth Day of September, 2014

Michelle K. Lee  
*Deputy Director of the United States Patent and Trademark Office*